United States Patent [19]

Akimune et al.

[11] 4,409,135
[45] Oct. 11, 1983

[54] PASTE CONTAINING ELECTRICALLY CONDUCTING POWDER TO FORM CONDUCTING SOLID FILLER IN CAVITY IN CERAMIC SUBSTRATE

[75] Inventors: Yoshio Akimune, Yokohama; Satoshi Ambe, Yokosuka, both of Japan

[73] Assignee: Nissan Motor Company, Limited, Yokohama, Japan

[21] Appl. No.: 247,943

[22] Filed: Mar. 26, 1981

[30] Foreign Application Priority Data

Apr. 25, 1980 [JP] Japan .................................. 55-54254

[51] Int. Cl.³ .............................................. H01B 1/02
[52] U.S. Cl. .................................... 252/514; 252/520; 252/521; 252/518; 252/519; 106/1.15; 106/174; 106/143 R
[58] Field of Search ............... 252/514, 518, 519, 520, 252/521; 106/1.15, 174, 1.21, 193 R, 1.24, 39.5, 39.7, 57, 74.3, 1.12; 338/25, 34; 422/95, 98; 73/27 R

[56] References Cited

U.S. PATENT DOCUMENTS

| 3,830,651 | 8/1974 | Minneman et al. ................. 106/1.15 |
| 4,032,350 | 6/1977 | Greenstein ...................... 252/514 X |
| 4,039,721 | 8/1977 | Weitze et al. ....................... 252/514 |
| 4,109,377 | 8/1978 | Blazrak et al. .................... 106/1.15 |
| 4,138,881 | 2/1979 | Isenberg ................... 338/34 |
| 4,187,486 | 2/1980 | Akohashi et al. .................. 252/514 |
| 4,219,448 | 8/1980 | Ross ..................................... 252/514 |

FOREIGN PATENT DOCUMENTS

| 1017487 | 1/1966 | United Kingdom . |
| 1152502 | 5/1969 | United Kingdom . |
| 1260023 | 1/1972 | United Kingdom . |
| 1428905 | 2/1976 | United Kingdom . |

Primary Examiner—Josephine Barr
Attorney, Agent, or Firm—Schwartz, Jeffery, Schwaab, Mack, Blumenthal & Koch

[57] ABSTRACT

Disclosed is a paste containing an electrically conducting powder, which is a mixture of a platinum powder and a ceramic material powder in a proportion in the range from 51:49 to 78:22 by volume and has a specific surface area of 1.0 to 10.0 m²/g, uniformly dispersed in an organic liquid vehicle in a proportion in the range from 70:30 to 50:50 by weight. A cavity in a ceramic substrate of an electric device having two, or more, conducting parts separately fixed to the substrate is filled up with this paste, and subsequently the substrate is fired to sinter the paste in the cavity into a conducting solid filler which provides electrical connection between the two conducting parts with low resistance and close and firm contact with the conducting parts and wall surfaces defining the cavity.

12 Claims, 7 Drawing Figures

PASTE CONTAINING ELECTRICALLY CONDUCTING POWDER TO FORM CONDUCTING SOLID FILLER IN CAVITY IN CERAMIC SUBSTRATE

BACKGROUND OF THE INVENTION

This invention relates to a paste which contains an electrically conducting powder which is useful to form a conducting solid filler in a cavity in a ceramic substrate of an electric or electronic device having at least two conducting parts separately fixed to the substrate such that the solid filler provides electrical connection between these conducting parts, and a method of filling such a cavity with a conducting solid filler by using a paste according to the invention.

There are many electric or electronic devices having a substrate of a ceramic material, and in some of such devices a hole or cavity is formed in the ceramic substrate and filled with an electrically conducting solid filler such that the filler serves as a junction between two, or more, conducting parts separately fixed to the substrate.

For example, there is a device having thin electrode layers deposited or printed on a major surface of a ceramic substrate and two thin lead wires which are partly embedded in the substrate to enhance mechanical strength. In such a device, electrical connection between each electrode layer and one of the lead wires is usually established by the following technique. Initially, a cavity or hole is formed in the substrate in a region covered with one of the electrode layers and another hole in a separate region covered with the other electrode layer. The end portions of the two lead wires are disposed in these two holes, respectively, and subsequently these two holes are filled up with an electrically conducting solid filler which remains in close contact with both the lead wire and the electrode layer. With the view to achieving complete filling of the respective holes, which are usually very small in dimensions, without damaging the lead wires and with good contact of the resultant solid filler with the electrode layer and lead wire in each hole, it is a usual method to form the conducting solid filler by first filling up each hole with a paste containing a metal powder and subsequently firing the substrate to cause sintering of the metal powder in the hole into a solid mass.

In practice, a typical example of pastes for this method is a dispersion of a mixture of a platinum powder and a glass powder in a liquid vehicle which is a solution of an organic polymer in a solvent. However, the result is often unsatisfactory because the paste in the hole undergoes significant shrinkage during the sintering process so that there are considerable gaps between the solid filler and the lead wire and wall surfaces defining the hole, whereby the electrical connection between the lead wire and the electrode layer becomes too high in resistance and low in reliability. Sometimes a microcrystalline wax is added to the above described paste composition with the intention of lessening the degree of shrinkage, but the effect of the addition of such a wax is limited and insufficient to ensure satisfactory results. Besides, when the ceramic substrate is initially prepared as a so-called green sheet and sintered afrer filling of the aforementioned holes with the paste, the wax contained in the paste is liable to exert a detrimental influence on the physical properties of the substrate. In addition, the high temperatures needed to melt the wax at the stage of filling the holes with the paste might be detrimental to the binder contained in the substrate as a green sheet.

SUMMARY OF THE INVENTION

It is an object of the present invention to provide a paste containing an electrically conducting powder, which paste can easily be filled into a cavity in a ceramic substrate of an electric or electronic device at room temperature and, through a sintering process, can be converted into a conducting solid filler which is in close and firm contact with wall surfaces defining the cavity and provides a good and reliable electrical connection between at least two conducting parts separately fixed to the substrate so as to intrude into the cavity or surround the periphery of the cavity.

It is another object of the invention to provide a method of filling a cavity in a ceramic substrate of an electric or electronic device with a conducting solid filler by using a paste according to the invention such that the solid filler provides electrical connection between at least two conducting parts separately fixed to the substrate.

A paste according to the invention comprises an electrically conducting powder mixture consisting of a platinum powder and a ceramic material powder and an organic liquid vehicle. In the powder mixture the proportion of the platinum powder to the ceramic powder is in the range from 51:49 to 78:22 by volume, and the specific surface area of this powder mixture is in the range from 1.0 to 10.0 $m^2/g$. The proportion of the powder mixture to the vehicle is in the range from 70:30 to 50:50 by weight.

Alumina and zirconia can be named as typical examples of ceramic materials useful for the powder mixture in this paste. It is preferable to use the same ceramic material as the material of the substrate to which the paste will be applied. Also it is preferable that the viscosity of the paste at room temperature is in the range from 30,000 to 100,000 centipoise. Usually the liquid vehicle is a solution of an organic polymer in a solvent.

Owing to the presence of a ceramic material powder in this paste and the specific limitations of the amounts of the respective ingredients and the specific surface area of the powder mixture, a paste according to the invention has an adequate viscosity and therefore can readily be filled into a cavity in a ceramic substrate at room temperature even when the cavity is very small, for example even when smaller than 1 mm both in diameter and in depth. More importantly, sintering of the paste in the cavity proceeds smoothly with only adequate degree of shrinkage to give a conducting solid filler which is sufficiently low in electric resistance and is in close and firm contact with the wall surfaces defining the cavity and the conducting parts to be electrically connected with each other.

In a method according to the invention, the aforesaid cavity is filled with a paste according to the invention, usually at room temperature, and subsequently the substrate is fired to sinter the paste in the cavity into a conducting solid filler.

Usually the firing process is performed in atmospheric air at a temperature in the range from 1100° C. to 1650° C. Additional objects, advantages and novel features of the invention will be set forth in part in the description which follows, and in part will become apparent to those skilled in the art upon examination of the following or may be learned by practice of the in-

DESCRIPTION OF THE PREFERRED EMBODIMENTS

Figure 1:
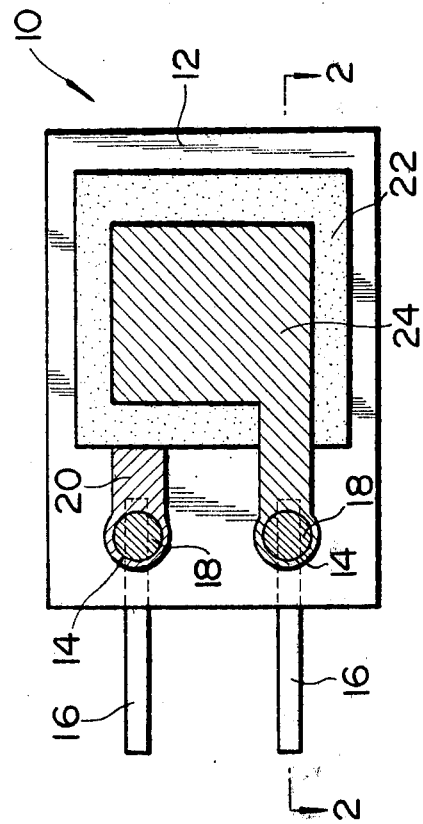
FIG. 1 is a schematic plan view of an oxygen sensor element which can be produced by using a paste according to the invention.
Figure 2:
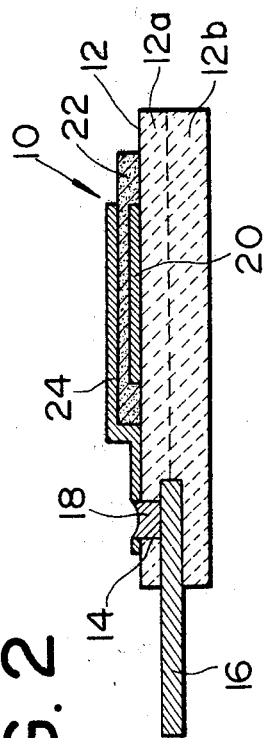
FIG. 2 is a sectional view taken along the line 2—2 of FIG. 1.

FIGS. 1 and 2 show an oxygen sensor element 10 of the oxygen concentration cell type utilizing an oxygen ion conductive solid electrolyte. This oxygen sensor element 10 is used, for example, in an exhaust system of an automotive engine to perform feedback control of air/fuel ratio of a gas mixture with which the engine is operated. A paste according to the invention is quite suitable for use in the fabrication of this oxygen sensor element 10.

A structurally basic member of this sensor element 10 is a substrate 12 which is formed of an electrically insulating ceramic material such as alumina, mullite, spinel, forsterite or zirconia. Formed on a major surface of the substrate 12 is a thin electrode layer 20, which is called a reference electrode layer. Either a suitable metal such as platinum or its alloy or a mixture of a certain metal and its oxide such as a Ni-NiO mixture is usually employed as the material of the reference electrode layer 20. A thin layer 22 of an oxygen ion conductive solid electrolyte as typified by $ZrO_2$ stabilized with $Y_2O_3$ or CaO is formed on the same side of the substrate 12 so as to cover substantially the entire area of the reference electrode layer 20, and another thin electrode layer 24 called a measurement electrode layer is formed porously on the outer surface of the solid electrolyte layer 22. Platinum or its alloys is popular as the material of the measurement electrode layer 24.

The three layers 20, 22, 24 laminated on the substrate 12 constitute an oxygen concentration cell which generates an electromotive force where there is a difference between a reference oxygen partial pressure at the reference electrode side of the solid electrolyte layer 22 and an oxygen partial pressure at the measurement electrode layer 24 which is allowed to contact a gas subject to measurement. To measure the generated electromotive force and also, where there is the need, to supply a small DC current to the concentration cell with the object of maintaining a reference oxygen partial pressure of an adequate level in the cell by causing a controlled migration of oxygen ion through the solid electrolyte layer 22, the sensor element 10 is provided with two lead wires 16 partly embedded in the substrate 12. In most cases these lead wires 16 are platinum wires.

In the illustrated example the substrate 12 is given by face-to-face bonding of two sheets 12a and 12b, which are initially prepared as so-called green sheets formed of a mixture of a powdered ceramic material and a liquid binder prepared by dissolving a suitable resin in a solvent. In a marginal region of the upper sheet 12a there are two through-holes 14 at a suitable distance therebetween. The upper sheet 12a in the green (unfired) state is placed on the lower sheet 12b in the green state and bonded to each other by application of an adequate load, preceded by placement of the lead wires 16 on the lower sheet 12b such that, when the upper sheet 12a is placed, end portions of the two wires 16 are exposed in the two holes 14 of the upper sheet 12a, respectively. The assembly of the two sheets 12a, 12b is fired to undergo sintering at a suitable stage during fabrication of the sensor element 10. For example, in the case of forming the reference electrode layer 20 by a physical vapor deposition technique the firing of the bonded two sheets 12a, 12b is performed before deposition of the electrode layer 20, but in the case of forming each of the three layers 20, 22, 24 of the concentration cell by the application of a paint- or paste-like composition containing a powdered electrode or solid electrolyte material, the substrate 12 in the green state and the three layers (20,22,24) formed by the application of paste-like compositions may be sintered simultaneously by a single firing process.

The reference electrode layer 20 has a narrow peninsula region which extends to one of the two holes 14 in the substrate 12 such that the entire periphery of this hole 14 is contained in this region of the electrode 20. Similarly the measurement electrode layer 24 has a narrow peninsula region which extends to, and surrounds the other hole 14.

In the completed oxygen sensor element 10, each of the two holes 14 is filled up with an electrically conducting filler 18 which provides electrical connection between the lead wire 16 initially exposed in this hole 14 and the electrode layer 20 or 24 surrounding the same hole 14. The conducting filler 18 is a sort of cermet which is a sintered mixture of platinum and a ceramic material resulting from firing a volume of a paste according to the invention filled into each hole 14 in the substrate 12. The two holes 14 are filled up with the paste after formation of the electrode layers 20,24, and the paste in the holes 14 is fired either simultaneously with or separately from firing of the substrate 12. Where the electrode layers 20,24 are each formed through the steps of applying a paint or paste containing a metal powder onto an underlying layer and firing the resultant paste layer, the firing of the paste in the holes 14 to sinter it into the solid filler 18 would be accomplished simultaneously with firing of the paste layers to become the electrode layers 20,24. Before firing, the paste in the holes 14 is preferably dried at a moderate temperature such as 50°–100° C. to evaporate most of the solvent contained in the paste as a component of the liquid vehicle. The firing of the paste in the holes 14 to sinter it into the conducting solid filler 18 is performed in atmospheric air usually at a temperature of 1100°–1650° C. for a period of 1–3 hours.

As specified hereinbefore, a paste according to the invention consists of a conducting powder mixture of platinum and a ceramic material and an organic liquid vehicle. There is no particular restriction on the kind of the ceramic material for this paste. Examples of suitable and readily available ceramic materials are alumina, spinel, mullite, forsterite and zirconia. Usually it is suitable to employ the same ceramic material as the ceramic substrate 12 or an essentially similar ceramic material. Of course the platinum powder in this paste provides electric conductivity of the paste or the solid filler 18 given by firing the paste. The ceramic material powder in this paste serves the functions of lessening the shrinkage of the paste during the firing process and enhancing the closeness and firmness of the contact of the solid filler 18 in the holes 14 of FIGS. 1 and 2 with the wall surfaces defining the respective holes 14.

To obtain the soid filler 18 with good conductivity and in close and firm contact with the wall surfaces in the holes 14, it is important that the proportion of the platinum powder to the ceramic material powder in the paste be within the range from 51:49 to 78:22 by volume. If the amount of the ceramic material in the powder mixture is made greater than 49 vol%, the sintered filler 18 becomes unsatisfactorily low in its electric conductivity because of insufficiency of the total volume occupied by the platinum powder. On the other hand, when the amount of the ceramic material powder in the powder mixture is smaller than 22 vol% the sintered filler 18 is liable to separate from the wall surfaces in the holes 14 because of very significant shrinkage of the paste during the firing process and lowering of firmness of the contact of the filler 18 with the mentioned surfaces in the ceramic substrate 12.

Also it is important that the particle sizes of the platinum powder and the ceramic material powder be such that the specific surface area of the mixture of these two kinds of powders is within the range from 1.0 to 10.0 $m^2/g$. If the specific surface are of this powder mixture is greater than 10.0 $m^2/g$, the resultant paste so easily undergoes sintering with augmented degree of shrinkage that the sintered filler 18 is liable to separate from the wall surfaces in the holes 14. However, if the specific surface area of this powder mixture is smaller than 1.0 $m^2/g$, it becomes difficult to attain a suitable degree of shrinkage of the paste or compacting of the solid particles in the paste during the firing process with the result that the sintered filler 18 becomes too low in its electric conductivity because of insufficiency of the contact of the platinum particles with each other.

The proportion of the conducting powder mixture to the organic liquid vehicle to constitute the paste should be determined within the range from 50:50 to 70:30 by weight primarily because, when this requirement is met besides the above described requirements to the conducting powder mixture, the viscosity of the paste becomes suitable for complete filling of the holes 14 which are in many cases very small in diameter. Numerically, it is preferable that the viscosity of the paste at 25° C. falls within the range from 30,000 to 100,000 cp (centipoises) because the paste with such a viscosity value exhibits satisfactorily good fluidity even in a considerably small hole so that every corner region of the hole can surely be filled up with the paste.

Figure 3A:
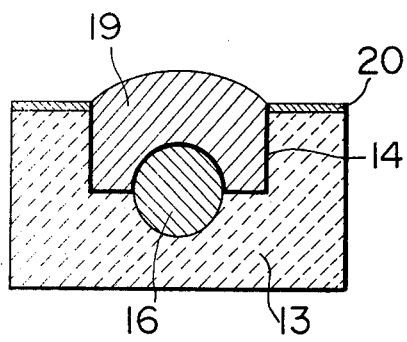
FIGS. 3(A) and (B) illustrate the manner of conversion of a small volume of a paste according to the invention filled into a hole in a ceramic substrate of the sensor element of FIGS. 1 and 2 into a conducting solid filler through a sintering process.
Figure 3B:
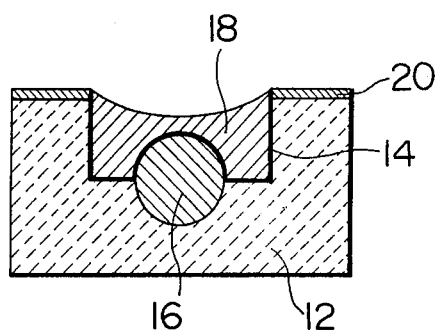

With respect to the oxygen sensor element 10 of FIGS. 1 and 2, FIG. 3 illustrates the manner of a complete filling of each hole 14 in an unfired substrate 13 with a paste 19 which meets all the requirements described above. The paste 19 is in good contact with the wall surfaces in the hole 14 even in corner regions. By drying the paste 19 in the hole 14 and thereafter firing the substrate 13 together with the paste 19 contained therein, this substrate 13 can be converted into the sintered ceramic substrate 12 with simultaneous sintering of the paste 19 in the hole 14 into conducting solid filler 18 which is in close and firm contact with the lead wire 16, electrode layer 20 (or 24) and the wall surfaces in the hole 14, as illustrated in FIG. 3(B), and accordingly provides electrical connection between the lead wire 16 and the electrode layer 20 (or 24) with a sufficiently low resistance.

Figure 4A:
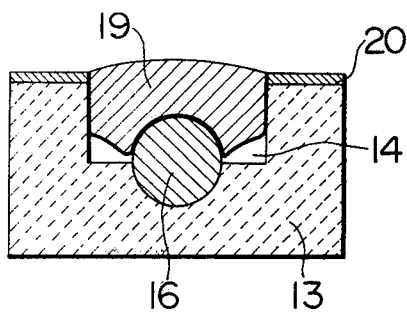
FIGS. 4(A) and (B) illustrate an example of unsatisfactory results of using a paste not in accordance with the invention in a filler-forming process as illustrated by FIGS. 3(A) and (B)
Figure 4B:
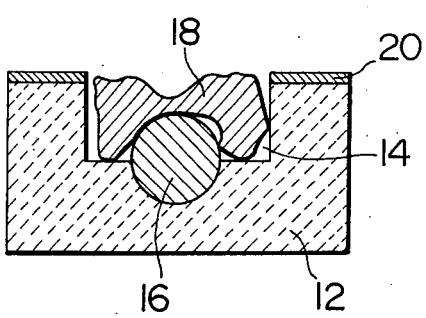

If the proportion of the conducting powder mixture in the paste is greater than the upper boundary of the above specified range with a resultant increase of the viscosity of the paste at normal temperature beyond 100,000 cp, it is likely that corner regions of the hole 14 are left unfilled with the paste 19 as illustrated in FIG. 4(A). When such an incomplete filling of the hole 14 with the paste 19 is followed by a usual firing process, the result is, as shown in FIG. 4(B), the appearance of considerable gaps between the sintered filler 18 insufficient in volume and irregular in shape and the lead wire 16, electrode layer 20 or 24 and wall surfaces in the hole 14. Naturally, electrical connection between the lead wire 16 and the electrode layer 20 or 24 becomes very poor or is practically broken.

Figure 5:
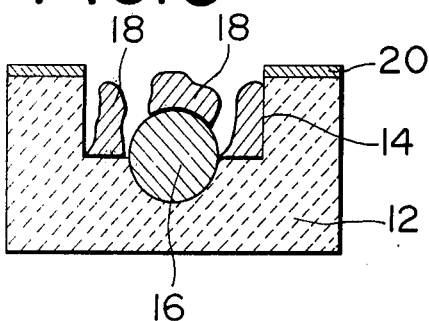
FIG. 5 illustrates another example of such unsatisfactory results.

When the proportion of the conducting powder mixture in the paste is considerably smaller than the lower boundary of the above specified range and therefore the viscosity of the paste at normal temperature is considerably lower than 30,000 cp, it is easy to accomplish complete filling of the hole 14 with the paste but in this case, after the firing process, the conducting solid filler 18 becomes broken into several pieces with gaps therebetween as illustrated in FIG. 5. Of course the solid filler 18 in such a state cannot provide a good electrical connection between the lead wire 16 and the electrode layer 20 or 24.

The materials for the organic liquid vehicle in a paste according to the invention can be chosen among various polymers and solvents insofar as the resultant vehicle can entirely be burned and dissipated during firing of the paste in a hole in a ceramic plate to sinter the paste into a conducting solid filler. A preferred example of the organic binder is a cellulose derivative such as ethyl cellulose or methyl cellulose, and terpineol is a solvent suitable to use in combination with such a binder. Usually it is suitable that the weight ratio of polymer to solvent in the liquid vehicle is in the range from 5:95 to 40:60.

The invention will be illustrated by the following examples.

EXAMPLE 1

Four kinds of pastes according to the invention were prepared by using the same materials but varying the proportion of the platinum powder to the ceramic material powder in the conducting powder mixture to thereby vary the viscosity of the pastes.

The materials of the conducting powder mixture were a platinum powder having a specific surface area of 6.6 $m^2/g$ and an $\alpha$-$Al_2O_3$ powder having a specific surface area of 9.2 $m^2/g$. The proportion of the platinum powder to the alumina powder was varied over the range from 51:49 to 78:22 by volume, so that the specific surface area of the conducting powder mixture varied in the range from 7.4 to 6.7 $m^2/g$.

Used as the liquid vehicle was a solution of 15 parts by weight of ethyl cellulose in 85 parts by weight of terpineol. The weight ratio of the conducting powder mixture to the liquid vehicle was constantly 70:30.

| | |
|---|---|
| Example 1A | the volume ratio of the platinum powder to the alumina powder was 51:49, and the viscosity of the paste (at 25° C.) was 100000 cp. |
| Example 1B | the volume ratio of platinum to alumina was 62:38, and the viscosity of the paste was 60000 cp. |
| Example 1C | the volume ratio of platinum to alumina was 71:29, and the viscosity was 40000 cp. |
| Example 1D | the volume ratio of platinum to the alumina was 78:22, and the viscosity was 30000 cp. |

REFERENCE 1

For the sake of comparison, three kinds of pastes were prepared generally in accordance with Example 1 except that the volume ratio of the platinum powder to the alumina powder was outside the range specified in the present invention.

| | |
|---|---|
| Reference 1P | the volume ratio of the platinum powder to the alumina powder was 30:70, and the viscosity of the paste (at 25° C.) was 200000 cp. |
| Reference 1Q | the volume ratio of platinum to alumina was 42:58, and the viscosity of the paste was 150000 cp. |
| Reference 1R | the volume ratio of platinum to alumina was 81:19, and the viscosity was 20000 cp. |

As an evaluation test, the pastes of Examples 1A–1D and References 1P–1R were each used in the fabrication of the oxygen sensor element 10 of FIGS. 1 and 2. The ceramic material of the substrate 12 was $\alpha$-$Al_2O_3$, and the holes 14 were 0.5 mm in diameter and 0.7 mm in depth. The lead wires 16 were platinum wires having a diameter of 0.2 mm. Each paste was filled into the holes 14 while the substrate 12 was still in the green state. After drying of the paste in the holes 14 at about 100° C. for about 1 hour, the substrate containing the paste was fired in atmospheric air at 1500° C. for 2 hours to sinter the alumina substrate 12 and simultaneously sinter the paste in the holes 14 into the conducting solid filler 18.

For every sample produced in this way, the electrical conductivity of the solid filler 18 was examined by measuring the resistance between each platinum wire 16 and the electrode layer 20 or 24, and the closeness of contact of the solid filler 18 with the wall surfaces in each hole 14 was examined by visual observation under microscope. The results are presented in the following Table 1.

In Table 1 (and also in succeeding Tables 2–6), the properties of the examined solid filler 18 are indicated by characters A, B and C in the following classification.
A: excellent
B: tolerable but not fully satisfactory
C: uselessly inferior

TABLE 1

| Paste | Pt/Al$_2$O$_3$ | Viscosity (cp) | Electric Conductivity | Closeness of Contact | Total Evaluation |
|---|---|---|---|---|---|
| Ref. 1p | 30:70 | 200000 | C | A | C |
| Ref. 1Q | 42:58 | 150000 | C | A | C |
| Ex. 1A | 51:49 | 100000 | A | A | A |
| Ex. 1B | 62:38 | 60000 | A | A | A |
| Ex. 1C | 71:29 | 40000 | A | A | A |
| Ex. 1D | 78:22 | 30000 | A | A | A |

TABLE 1-continued

| Paste | Pt/Al$_2$O$_3$ | Viscosity (cp) | Electric Conductivity | Closeness of Contact | Total Evaluation |
|---|---|---|---|---|---|
| Ref. 1R | 81:19 | 20000 | B | C | C |

EXAMPLE 2

Prepared in this example were five kinds of pastes all according to the invention but different from each other in the specific surface area of the conducting powder mixture. The raw materials for these pastes were similar to the materials used in Example 1 except that the particle sizes of the platinum powder and the alumina powder were varied to vary the specific surface area of the powder mixture within the range from 1.0 to 10.0 m$^2$/g.

The proportion of the platinum powder to the alumina powder in the conducting powder mixture was constantly 62:38 by volume, and the proportion of the conducting powder mixture to the organic liquid vehicle was constantly 70:30 by weight.

These pastes were subjected to the evaluation test described above with respect to the pastes of Example 1. The results are presented in the following Table 2.

REFERENCE 2

For comparison, two kinds of pastes were prepared generally in accordance with Example 2 except that the specific surface area of the conducting powder mixture was outside the range specified in the present invention, that is, 0.5 m$^2$/g in Reference 2P, and 12.0 m$^2$/g in Reference 2Q.

These two pastes, too, were subjected to the aforementioned evaluation test.

TABLE 2

| Paste | Specific Surface Area (m$^2$/g) | Viscosity (cp) | Electric Conductivity | Closeness of Contact | Total Evaluation |
|---|---|---|---|---|---|
| Ref. 2P | 0.5 | 20000 | B | B | C |
| Ex. 2A | 1.0 | 30000 | A | A | A |
| Ex. 2B | 4.0 | 60000 | A | A | A |
| Ex. 2C | 6.0 | 80000 | A | A | A |
| Ex. 2D | 8.0 | 90000 | A | A | A |
| Ex. 2E | 10.0 | 100000 | A | A | A |
| Ref. 2Q | 12.0 | 120000 | C | B | C |

EXAMPLE 3

Using the same raw materials as in Example 1, three kinds of pastes according to the invention were prepared by varying the weight ratio of the conducting powder mixture to the liquid vehicle to 70:30, 60:40 and 50:50.

The proportion of the platinum powder to the alumina powder was constantly 62:38 by volume, and the specific surface area of the resultant conducting powder mixture was 4.5 m$^2$/g. The composition of the liquid vehicle was the same as in Example 1.

These pastes were subjected to the above described evaluation test. The results are presented in the following Table 3.

REFERENCE 3

Four kinds of pastes were prepared generally in accordance with Example 3 except that the weight ratio of the conducting powder mixture to the liquid vehicle was outside the range specified in the present invention, as shown in Table 3. These pastes, too, were subjected to the aforementioned evaluation test.

TABLE 3

| Paste | Powder/ Vehicle | Viscosity (cp) | Electric Conductivity | Closeness of Contact | Total Evaluation |
|---|---|---|---|---|---|
| Ref. 3P | 90:10 | 300000 | B | C | C |
| Ref. 3Q | 80:20 | 180000 | B | B | C |
| Ex. 3A | 70:30 | 100000 | A | A | A |
| Ex. 3B | 60:40 | 50000 | A | A | A |
| Ex. 3C | 50:50 | 30000 | A | A | A |
| Ref. 3R | 40:60 | 20000 | C | B | C |
| Ref. 3S | 20:80 | 10000 | C | C | C |

In the cases of the pastes of Ref. 3P and Ref. 3Q, each paste in the holes 14 of the substrate 12 and the sintered solid filler 18 became defective in the way as illustrated in FIGS. 4(A) and 4(B) because of excessively large proportion of the powder mixture in the paste. The paste of Ref. 3S exhibited excessively high fluidity, so that the sintered filler 18 became as illustrated in FIG. 5.

EXAMPLE 4

The purpose of this example was similar to that of Example 1. In this example, however, a powder of a stabilized zirconia (mixture of 90 Wt% of $ZrO_2$ and 10 Wt% of $Y_2O_3$ added as a stabilizing component) was used as the ceramic material powder to be mixed with platinum powder. The specific surface area of the stabilized zirconia powder was 9.6 $m^2/g$, and that of the platinum powder was 2.0 $m^2/g$.

Four kinds of pastes according to the invention were prepared by varying the proportion of the platinum powder to the zirconia powder in the conducting powder mixture within the range from 51:49 to 78:22 by volume, as shown in the following Table 4. The liquid vehicle used in Example 1 was used also in this example. The weight ratio of the conducting powder mixture to the liquid vehicle was constantly 70:30.

These pastes were subjected to the evaluation test described in connection with Example 1. In this case, therefore, the material (alumina) of the substrate 12 was different from the ceramic material (zorconia-yttria) in the pastes. The results of the test are presented in Table 4.

REFERENCE 4

Two kinds of pastes were prepared generally in accordance with Example 4 except that the volume ratio of the platinum powder to the zirconia powder was outside the range specified in the present invention, that is, 38:62 in Reference 4P, and 83.5:16.5 in Reference 4Q. These two pastes, too, were subjected to the aforementioned evaluation test.

TABLE 4

| Paste | Platinum/ Stabilized Zirconia | Viscosity (cp) | Electric Conductivity | Closeness of Contact | Total Evaluation |
|---|---|---|---|---|---|
| Ref. 4P | 38:62 | 200000 | C | A | C |
| Ex. 4A | 51:49 | 100000 | A | A | A |
| Ex. 4B | 58:42 | 80000 | A | A | A |
| Ex. 4C | 66:34 | 50000 | A | A | A |
| Ex. 4D | 78:22 | 30000 | A | A | A |
| Ref. 4Q | 83.5:16.5 | 20000 | A | C | C |

EXAMPLE 5

Prepared in this example were four kinds of pastes all according to the invention but different from each other in the specific surface area of the conducting powder mixture. The raw materials for these pastes were essentially similar to the materials used in Example 4 except that the particle size of the platinum powder and the stabilized zirconia powder were varied to vary the specific surface area of the powder mixture within the range from 1.0 to 10.0 $m^2/g$, as shown in the following Table 5. More particularly, the specific surface area was varied by using suitable amounts of three kinds of platinum powders respectively having specific surface area values of 0.5 $m^2/g$, 7.4 $m^2/g$ and 15.1 $m^2/g$ and three kinds of stabilized zirconia powders respectively having specific surface area values of 4.0 $m^2/g$, 9.2 $m^2/g$ and 15.6 $m^2/g$.

These pastes were subjected to the evaluation test similarly to the pastes of the foregoing examples. The results are shown in Table 5.

REFERENCE 5

Two kinds of pastes were prepared generally in accordance with Example 5, except that the specific surface area of the conducting powder mixture was outside the range specified in the present invention, that is, 0.8 $m^2/g$ in Reference 5P, and 11.0 $m^2/g$ in Reference 1Q. These two pastes, too, were subjected to the aforementioned evaluation test.

TABLE 5

| Paste | Specific Surface Area ($m^2/g$) | Viscosity (cp) | Electric Conductivity | Closeness of Contact | Total Evaluation |
|---|---|---|---|---|---|
| Ref. 5P | 0.8 | 20000 | C | C | C |
| Ex. 5A | 1.0 | 30000 | A | A | A |
| Ex. 5B | 4.0 | 50000 | A | A | A |
| Ex. 5C | 8.5 | 80000 | A | A | A |
| Ex. 5D | 10.0 | 100000 | A | A | A |
| Ref. 5Q | 11.0 | 140000 | A | C | C |

EXAMPLE 6

Using the same raw materials as in Example 4, three kinds of pastes according to the invention were prepared by varying the weight ratio of the conducting powder mixture to the liquid vehicle within the range from 70:30 to 50:50 as shown in the following Table 6. The proportion of the platinum powder (which had a specific surface area of 2.0 $m^2/g$) to the stabilized zirconia powder (which had a specific surface area of 9.6 $m^2/g$) was constantly 66:34 by volume.

These pastes were subjected to the evaluation test similarly to the pastes of the foregoing examples. The results are presented in Table 6.

REFERENCE 6

Four kinds of pastes were prepared generally in accordance with Example 6, except that the weight ratio of the conducting powder mixture to the liquid vehicle was outside the range specified in the present invention, as shown in Table 6. These pastes, too, were subjected to the aforementioned evaluation test.

TABLE 6

| Paste | Powder/Vehicle | Viscosity (cp) | Electric Conductivity | Closeness of Contact | Total Evaluation |
|---|---|---|---|---|---|
| Ref. 6P | 90:10 | 400000 | B | C | C |
| Ref. 6Q | 80:20 | 200000 | A | B | B |
| Ex. 6A | 70:30 | 100000 | A | A | A |
| Ex. 6B | 60:40 | 50000 | A | A | A |
| Ex. 6C | 50:50 | 30000 | A | A | A |
| Ref. 6R | 40:60 | 20000 | C | B | C |
| Ref. 6S | 20:80 | 10000 | C | C | C |

Needless to mention, neither the materials and specific compositions of the pastes in the foregoing examples nor the construction and materials of the illustrated oxygen sensor element 10 are limitative. For instance, the lead wires 16 may be replaced by film-like conducting layers deposited on the lower sheet 12b of the substrate 12. Furthermore, a paste according to the invention can be used in the fabrication of various devices which need not to be oxygen sensors or other kinds of gas sensors.

The foregoing description of the present invention has been presented for purposes of illustration and description. It is not intended to be exhaustive or to limit the invention in the precise form disclosed, and obviously many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A paste for forming an electrically conducting solid filler for a cavity in a substrate comprised of a ceramic material, of a device having at least two electrically conducting parts separately fixed to the substrate such that the solid filler provides an electrical connection between the conducting parts, the paste comprising:

an electrically conducting powder mixture comprising a platinum powder and a ceramic material powder selected from the group consisting of an alumina powder and a zirconia powder, the proportion of said platinum powder to said ceramic material powder being in the range from 51:49 to 78:22 by volume, the specific surface area of said powder mixture being in the range from 1.0 to 10.0 m$^2$/g; and an organic liquid vehicle, the proportion of said powder mixture to said vehicle being in the range from 70:30 to 50:50 by weight.

2. A paste according to claim 1, wherein the viscosity of the paste at 25° C. is in the range from 30,000 to 100,000 centipoise.

3. A paste according to claim 1, wherein said vehicle is a solution of an organic polymer in a solvent.

4. A paste according to claim 3, wherein said organic polymer is a cellulose derivative.

5. A paste according to claim 4, wherein said solvent is terpineol.

6. In a method of filling up a cavity in a substrate comprised of a ceramic material, of a device having at least two electrically conducting parts separately fixed to the substrate with an electrically conducting solid filler such that the solid filler provides electrical connection between the conducting parts, the method comprising the steps of filling up the cavity with a paste containing an electrically conducting powder and subsequently firing the substrate in atmospheric air at a temperature in the range of about from 1100° C. to 1650° C. to cause sintering of the paste in the cavity into the solid filler, said paste containing an electrically conducting powder mixture comprising a platinum powder and a ceramic material powder selected from the group consisting of an alumina powder and a zirconia powder dispersed uniformly in an organic liquid vehicle, the proportion of said platinum powder to said ceramic powder being in the range from 51:49 to 78:22 by volume, the specific surface area of said powder mixture being in the range from 1.0 to 10.0 m$^2$/g, the proportion of said powder mixture to said vehicle being in the range from 70:30 to 50:50 by weight.

7. A method according to claim 6, wherein the viscosity of said paste at 25° C. is in the range from 30,000 to 100,000 centipoise.

8. A method according to claim 7, wherein said substrate comprises alumina or zirconia type materials.

9. A method according to claim 7, wherein said vehicle is a solution of a cellulose derivative in a solvent.

10. A method according to claim 6 or 7, wherein said paste is filled into said cavity at room temperature.

11. A paste according to claim 1 or 2, wherein said ceramic material powder is a zirconia powder containing a stabilizing oxide selected from the group consisting of yttria and calcia.

12. A method according to claim 7, wherein said ceramic material powder is a zirconia powder containing a stabilizing oxide selected from the group consisting of yttria and calcia.

* * * * *